United States Patent
Hung et al.

(10) Patent No.: US 12,287,374 B2
(45) Date of Patent: Apr. 29, 2025

(54) METHOD FOR ESTIMATING DIRECT CURRENT INTERNAL RESISTANCE OF BATTERY

(71) Applicant: STL TECHNOLOGY CO., LTD., Kaohsiung (TW)

(72) Inventors: Shih Fa Hung, Kaohsiung (TW); Chong-Yong Wu, Kaohsiung (TW); Wen-Fan Chang, Kaohsiung (TW)

( * ) Notice: Subject to any disclaimer, the term of this patent is extended or adjusted under 35 U.S.C. 154(b) by 178 days.

(21) Appl. No.: 18/219,997

(22) Filed: Jul. 10, 2023

(65) Prior Publication Data

US 2024/0053406 A1 Feb. 15, 2024

(30) Foreign Application Priority Data

Aug. 12, 2022 (TW) .................................. 111130498

(51) Int. Cl.
*G01R 31/389* (2019.01)
*G01R 31/3842* (2019.01)
*H02J 7/00* (2006.01)

(52) U.S. Cl.
CPC ....... *G01R 31/389* (2019.01); *G01R 31/3842* (2019.01); *H02J 7/0047* (2013.01)

(58) Field of Classification Search
None
See application file for complete search history.

(56) References Cited

U.S. PATENT DOCUMENTS

2013/0289854 A1* 10/2013 Takahashi ............... B60L 53/00
701/112

* cited by examiner

*Primary Examiner* — Jas A Sanghera
(74) *Attorney, Agent, or Firm* — Chun-Ming Shih; HDLS IPR SERVICES (57) ABSTRACT

The invention presents a method for estimating a direct current internal resistance of a battery, which defines a depth of discharge detection interval including a first threshold and a second threshold. When the battery is discharging, a currently battery voltage are periodically measured, a currently depth of discharge is calculated, and an open-circuit voltage is queried. The currently battery voltage is subtracted from the open-circuit voltage to obtain a voltage difference. The voltage difference is continuously accumulated to obtain a currently accumulated voltage difference. The currently depth of discharge reaches the first threshold or the second threshold, the currently accumulated voltage difference is a first accumulated voltage difference or a second accumulated voltage difference. A difference value between the first accumulated voltage difference and the second accumulated voltage difference is divided by a discharging amount in the depth of discharge detection interval to obtain the direct current internal resistance.

7 Claims, 5 Drawing Sheets

METHOD FOR ESTIMATING DIRECT CURRENT INTERNAL RESISTANCE OF BATTERY

This non-provisional application claims priority claim under 35 U.S.C. § 119(a) on Taiwan Patent Application No. 111130498 filed Aug. 12, 2022, the entire contents of which are incorporated herein by reference.

FIELD OF THE INVENTION

The present invention relates to a method for estimating a direct current internal resistance of a battery, in particular, to a method for estimating a direct current internal resistance of a battery in a discharge process of the battery.

BACKGROUND

A battery's internal resistance refers to a resistance to a current passing through the inside of a battery. The less the direct current internal resistance of the battery is, the less the voltage drop inside the battery will be when it outputs the current, and thus the stronger the battery discharging amount will be. In contrast, the greater the direct current internal resistance of the battery is, the greater the voltage drop inside the battery will be when it outputs the current, and thus the weaker the battery discharging amount will be. Therefore, the direct current internal resistance is an important index to measure battery performance.

A direct current internal resistance estimation method developed by IEC 61690 is currently the most common method to estimate the direct current internal resistance of the battery. Two stages of discharge are specified in the direct current internal resistance estimation method of IEC 61690. Firstly, at the first stage of discharge, discharge is performed at a discharge rate of 0.2 C for 10 seconds, and a battery voltage $V_1$ and a discharge current $I_1$ are recorded. Then, at the second stage of discharge, discharge is performed at a discharge rate of 1 C for 1 second, and a battery voltage $V_2$ and a discharge current $I_2$ are recorded. Finally, the direct current internal resistance $R_{DC}$ of the battery can be obtained by dividing a difference value between the two battery voltages by a difference value between the two discharge currents, such as Rdc(V1−V2) (I2−I1).

However, the direct current internal resistance estimation method of IEC 61690 is only suitable for estimating the direct current internal resistance when the battery is idle, and when the battery actually runs, it is impossible to perform corresponding operations according to the conditions of two stages of discharge specified in the direct current internal resistance estimation method of IEC 61690. Moreover, the direct current internal resistance estimation method of IEC 61690 will estimate different direct current internal resistances under a condition of different depths of discharge. For example, a direct current internal resistance estimated by the direct current internal resistance estimation method of IEC 61690 at a depth of discharge of 70% is different from a direct current internal resistance estimated at a depth of discharge of 50%. Therefore, the previous direct current internal resistance estimation method of IEC 61690 has the problem that the estimated direct current internal resistance is not accurate enough.

In view of this, the invention presents an innovative method for estimating a direct current internal resistance of a battery. The method can estimate a relatively accurate direct current internal resistance, which will be the objective of the invention.

SUMMARY

An objective of the invention is to provide a method for estimating a direct current internal resistance of a battery, which defines a depth of discharge detection interval including a first depth of discharge threshold value and a second depth of discharge threshold value. In the discharge process of the battery, a currently discharge current and battery voltage of the battery are periodically measured, a currently depth of discharge is calculated, and an open-circuit voltage corresponding to the currently depth of discharge is queried from an open-circuit voltage curve or a lookup table. The currently battery voltage is subtracted from the open-circuit voltage corresponding to the currently depth of discharge to obtain a voltage difference, and the voltage difference is continuously accumulated to obtain a currently accumulated voltage difference. When the currently depth of discharge reaches the first depth of discharge threshold value of the depth of discharge detection interval, the currently accumulated voltage difference is a first accumulated voltage difference. When the currently depth of discharge reaches the second depth of discharge threshold value of the depth of discharge detection interval, the currently accumulated voltage difference is a second accumulated voltage difference. A direct current internal resistance can be obtained by dividing a difference value between the first accumulated voltage difference and the second accumulated voltage difference by a discharging amount in the depth of discharge detection interval.

In order to achieve the above objective, the invention provides a method for estimating a direct current internal resistance, which is applied to a battery and includes: defining a depth of discharge detection interval including a first depth of discharge threshold value and a second depth of discharge threshold value; executing a direct current internal resistance estimation process via a direct current internal resistance estimation program when the battery is in a discharge state, the direct current internal resistance estimation process including: periodically measuring a currently discharge current and currently battery voltage of the battery; calculating a currently depth of discharge according to the periodically measured currently discharge current; querying an open-circuit voltage corresponding to the currently depth of discharge from an open-circuit voltage curve or a lookup table; subtracting the currently battery voltage from the open-circuit voltage corresponding to the currently depth of discharge to obtain a voltage difference, and continuously accumulating the voltage difference to obtain a currently accumulated voltage difference; if the currently depth of discharge is greater than or equal to the first depth of discharge threshold value, the currently accumulated voltage difference being a first accumulated voltage difference; and if the currently depth of discharge is greater than or equal to the second depth of discharge threshold value, the currently accumulated voltage difference being a second accumulated voltage difference; and dividing a difference value between the first accumulated voltage difference and the second accumulated voltage difference by a discharging amount in the depth of discharge detection interval to obtain the direct current internal resistance.

In an embodiment of the invention, wherein the direct current internal resistance estimation program includes a $1^{ST}$ flag and a $2^{ND}$ flag. When the $1^{ST}$ flag is set as 1, an action of detecting whether the currently depth of discharge reaches the first depth of discharge threshold value is enabled. In a case that the $1^{ST}$ flag is set as 0, the action of detecting whether the currently depth of discharge reaches the first depth of discharge threshold value is disabled, and when the $2^{ND}$ flag is set as 1, an action of detecting whether the currently depth of discharge reaches the second depth of discharge threshold value is enabled. When the $2^{ND}$ flag is set as 0, the action of detecting whether the currently depth of discharge reaches the second depth of discharge threshold value is disabled.

In an embodiment of the invention, wherein the method further includes: before executing the direct current internal resistance estimation process, executing a process for monitoring whether the battery is in the discharge state, if yes, executing the direct current internal resistance estimation process, and if not, executing a process for monitoring whether the battery is fully charged; and executing the process for monitoring whether the battery is fully charged includes: if the battery is monitored to be fully charged, then setting the $1^{ST}$ flag as 1, setting the $2^{ND}$ flag as 0, and returning to executing the process for monitoring whether the battery is in the discharge state; or if the battery is monitored not to be fully charged, then setting the $1^{ST}$ flag as 0, setting the $2^{ND}$ flag as 0, and continuing to execute the process for monitoring whether the battery is fully charged.

In an embodiment of the invention, before executing the direct current internal resistance estimation process, the battery is fully charged, the $1^{ST}$ flag is set as 1, and the $2^{ND}$ flag is set as 0.

In an embodiment of the invention, when the currently depth of discharge is greater than or equal to the first depth of discharge threshold value and less than the second depth of discharge threshold value, the $1^{ST}$ flag is changed from 1 to 0, and the $2^{ND}$ flag is changed from 1 to 0. When the currently depth of discharge is greater than or equal to the second depth of discharge threshold value, the $2^{ND}$ flag is changed from 1 to 0.

In an embodiment of the invention, wherein a measuring process of an open-circuit voltage curve is executed in advance before performing the method for estimating the direct current internal resistance, the measuring process of the open-circuit voltage curve comprising: fully charging the battery; discharging the battery at a constant discharge current; periodically measuring a currently open-circuit voltage of the battery; obtaining the currently depth of discharge according to a currently discharging amount of the battery; recording the currently open-circuit voltage corresponding to a currently discharge time and the currently depth of discharge corresponding to the currently discharge time; and determining whether the currently open-circuit voltage of the battery is equal to a cut-off discharge voltage, if the currently open-circuit voltage of the battery is equal to the cut-off discharge voltage, then the discharging of the battery being stopped to construct the open-circuit voltage curve according to each of the currently open-circuit voltages and each of the current depths of discharge corresponding to each of the currently discharge times; and if the currently open-circuit voltage of the battery is greater than the cut-off discharge voltage, then the discharging of the battery being continued, and recording of the currently open-circuit voltage corresponding to the currently discharge time and the currently depth of discharge corresponding to the currently discharge time being continued.

In an embodiment of the invention, wherein the method further includes: before executing the direct current internal resistance estimation process, measuring whether the present current of the battery is less than zero, if the present current is less than zero and the battery is in the discharge state, the direct current internal resistance estimation process being executed; and if the present current is greater than or equal to zero and the battery is in a charge state or a static state, whether the battery is fully charged being monitored.

DETAILED DESCRIPTION OF THE PREFERRED EMBODIMENTS

Figure 1:
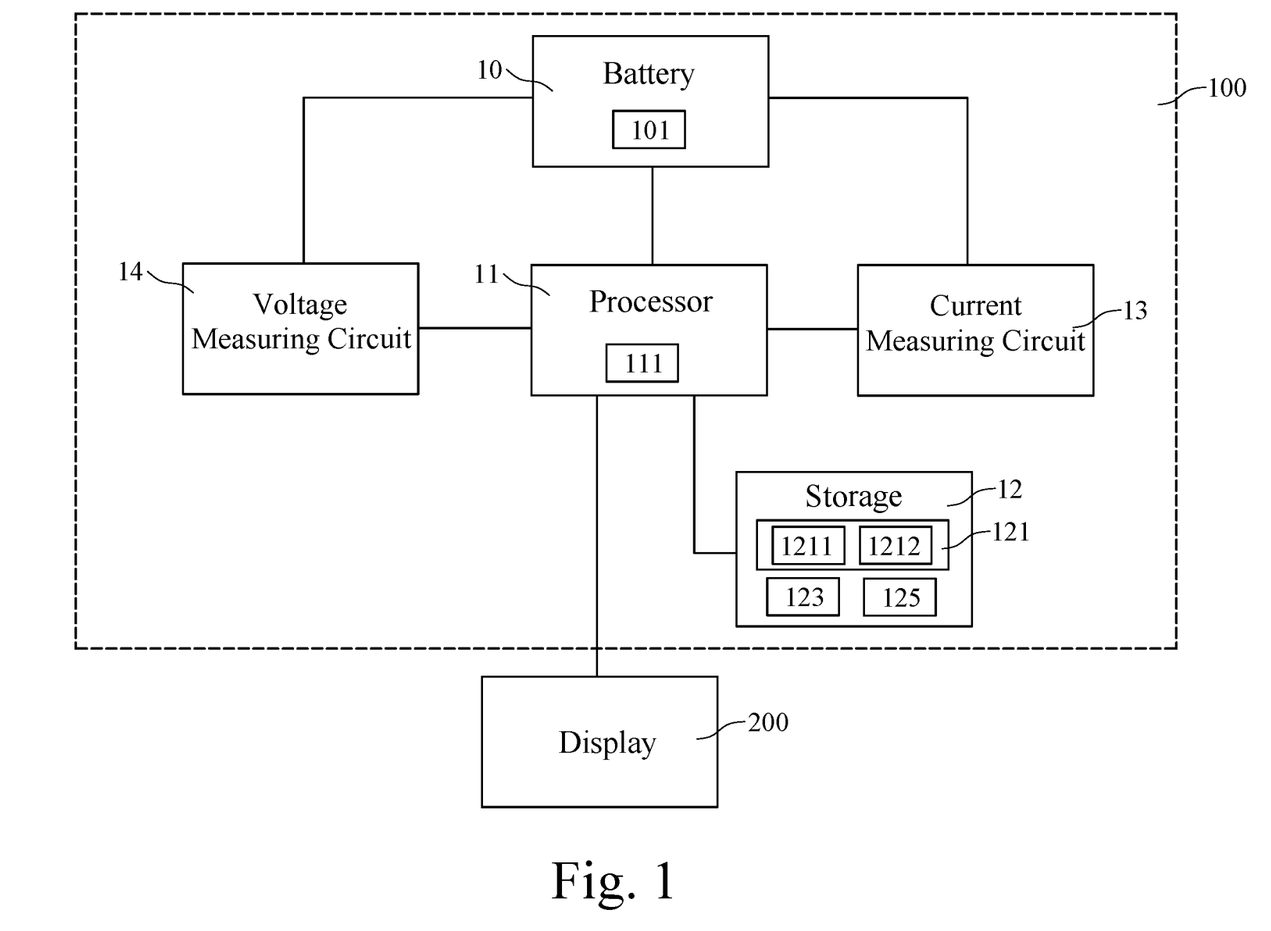
FIG. 1 is a circuit block diagram of a battery module according to the invention.

Referring to FIGS. 1, 2, 3, 4 and 5, they are a circuit block diagram of a battery module according to the invention, a flow chart of measuring an open-circuit voltage curve of a battery according to the invention, a flow chart of a method for estimating a direct current internal resistance of the battery according to the invention, a curve chart of an open-circuit voltage and a battery voltage of the battery according to the invention, and a curve chart of the direct current internal resistance of the battery according to the invention, respectively. As shown in FIG. 1, the battery module 100 of the present invention includes a battery 10, a processor 11, a storage 12, a current measuring circuit 13 and a voltage measuring circuit 14. The processor 11 is connected with the battery 10, the storage 12, the current measuring circuit 13 and the voltage measuring circuit 14. The storage 12 is a non-volatile memory, such as a flash memory, which is configured to store a direct current internal resistance estimation program 121. The processor 11 can estimate a numerical value of a direct current internal resistance ($R_{DC}$) 101 of the battery 10 by the direct current internal resistance estimation program 121, and store the estimated direct current internal resistance 101 in the storage 12. In an embodiment of the invention, the battery module 100 can be further connected with a display 200, and the direct current internal resistance ($R_{DC}$) 101 estimated by the processor 11 can also be displayed on the display 200.

Figure 2:
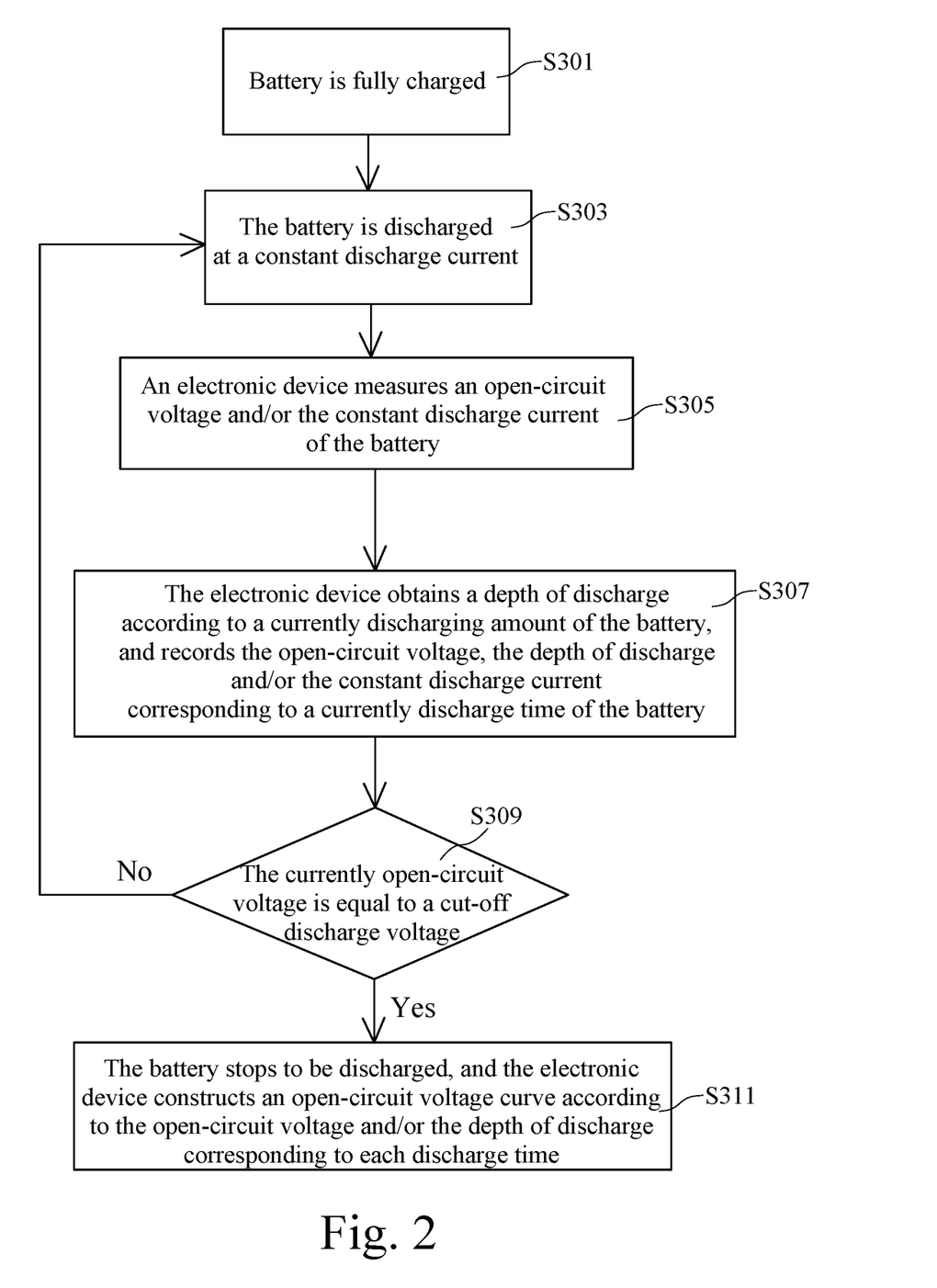
FIG. 2 is a flow chart of measuring an open-circuit voltage curve of a battery according to the invention.
Figure 4:
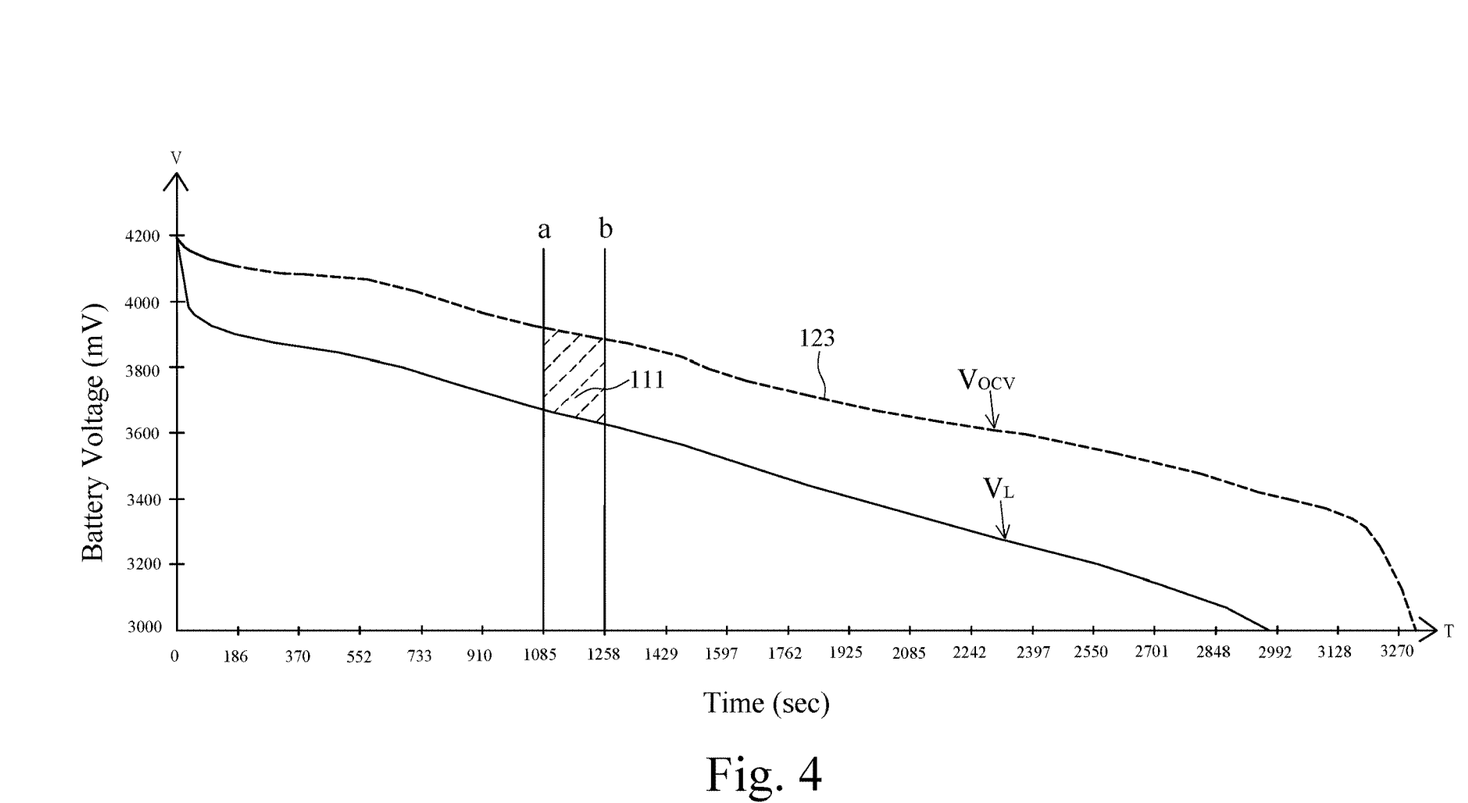
FIG. 4 is a curve chart of an open-circuit voltage and a battery voltage of the battery according to the invention.

Additionally, the battery module 100 of the present invention will execute a measuring process of an open-circuit voltage curve on the battery 10 in advance before estimating the direct current internal resistance ($R_{DC}$) 101 of the battery 10. As shown in FIG. 2, in the process of measuring the open-circuit voltage curve of the battery 10, firstly, at step S301, the battery 10 is fully charged under a standard charge condition. Then, at step S303, the battery 10 is discharged at a micro and constant discharge current (e.g., $I_D$=0.1 mA). At step S305, an electronic device (e.g., a working computer) periodically measures a currently open-circuit voltage ($V_{ocv}$) and/or a constant discharge current ($I_D$) of the battery 10 in discharging via a voltage and current measuring device. At step S307, the electronic device obtains a currently depth of discharge (DOD) according to a currently discharging amount ($I_D \times T$) of the battery 10, e.g., T being a currently discharge time, and records the currently open-circuit voltage ($V_{ocv}$), the currently depth of discharge (DOD) and/or the constant discharge current ($I_D$) corresponding to the currently discharge time (T) of the battery 10. Then, at step S309, the electronic device determines whether the currently open-circuit voltage ($V_{ocv}$) of the battery 10 is equal to a cut-off discharge voltage, if not, it returns to steps S303, S305 and S307, and the electronic device continues to record an open-circuit voltage ($V_{ocv}$), a depth of discharge (DOD) and/or a constant discharge current ($I_D$) corresponding to a next discharge time (T) of the battery 10; and if the currently open-circuit voltage ($V_{ocv}$) of the battery 10 is equal to the cut-off discharge voltage, step S311 is performed, in which the battery 10 stops being discharged, and then the electronic device constructs an open-circuit voltage ($V_{ocv}$) curve 123 according to the open-circuit voltage ($V_{ocv}$) and/or the depth of discharge (DOD) corresponding to each discharge time (T), as shown in FIG. 4. In an embodiment of the invention, the electronic device stores the open-circuit voltage curve 123 in the storage 12.

In another embodiment of the present invention, the electronic device can also create a lookup table 125 through recorded information of each open-circuit voltage ($V_{ocv}$) corresponding to each depth of discharge (DOD) and store the lookup table 125 in the storage 12 of the battery module 100. The lookup table 125 is a corresponding table of the depths of discharge (DOD) and open-circuit voltages ($V_{ocv}$) of the battery 10, which lists the open-circuit voltage ($V_{ocv}$) corresponding to each depth of discharge (DOD). For example, the depth of discharge of 0 mAh corresponds to the open-circuit voltage of 4,180 mV, the depth of discharge of 400 mAh corresponds to the open-circuit voltage of 3,900 mV, . . . , the depth of discharge of 2000 mAh corresponds to the open-circuit voltage of 3,000 mV, etc.

Additionally, the processor 11 defines a depth of discharge detection interval 111. The depth of discharge detection interval 111 is set with a first depth of discharge threshold value ($DOD_A$) and a second depth of discharge threshold value ($DOD_B$). The second depth of discharge threshold value ($DOD_B$) is greater than the first depth of discharge threshold value ($DOD_A$). For example, the first depth of discharge threshold value ($DOD_A$) can be selectively set as 600 mAh, and the second depth of discharge threshold value ($DOD_B$) can be selectively set as 700 mAh. Moreover, the threshold values set by the processor 11 to the depth of discharge detection interval 111 are only examples, and the processor 11 can also appropriately adjust the size of the detection interval 111 and the depth of discharge threshold values thereof according to the accuracy of estimating the direct current internal resistance 101. Additionally, the direct current internal resistance estimation program 121 includes a $1^{ST}$ flag 1211 and a $2^{ND}$ flag 1212. If the $1^{ST}$ flag 1211 is set as 1 by the processor 11, then the processor 11 enables an action of detecting whether the depth of discharge (DOD) of the battery 10 reaches the first depth of discharge threshold value ($DOD_A$); otherwise, if the $1^{ST}$ flag 1211 is set as 0 by the processor 11, then the processor 11 disables the action of detecting whether the depth of discharge (DOD) of the battery 10 reaches the first depth of discharge threshold value ($DOD_A$). If the $2^{ND}$ flag 1212 is set as 1 by the processor 11, then the processor 11 enables an action of detecting whether the depth of discharge (DOD) of the battery 10 reaches the second depth of discharge threshold value ($DOD_B$); otherwise, if the $2^{ND}$ flag 1212 is set as 0 by the processor 11, then the processor 11 disables the action of detecting whether the depth of discharge (DOD) of the battery 10 reaches the second depth of discharge threshold value ($DOD_B$).

The battery module 100 of the present invention serves as a power supply apparatus for a loading apparatus and can perform the method for estimating the direct current internal resistance ($R_{DC}$) 101 of the battery 10 at the moment of supplying power to the loading apparatus. As shown in FIGS. 1, 3, 4 and 5, the processor 11 of the battery module 100 of the present invention performs the method for estimating the direct current internal resistance ($R_{DC}$) 101 of the battery 10 by means of the direct current internal resistance estimation program 121. The steps of the method are described as follows. Firstly, at step S331, the processor 11 monitors whether the battery 10 is in a discharge state. For example, the processor 11 utilizes the current measuring circuit 13 to measure whether the present current ($I_L$) of the battery 10 is less than zero. If the present current ($I_L$) is less than zero, the processor 11 determines that the battery 10 is in the discharge state, and then executes a direct current internal resistance estimation process S35. Otherwise, if the present current ($I_L$) is greater than or equal to zero, the processor 11 determines that the battery 10 is in a charge state or a static state (also known as a non-charge and discharge state), and performs step S333 to monitor whether the battery 10 is fully charged.

Figure 3:
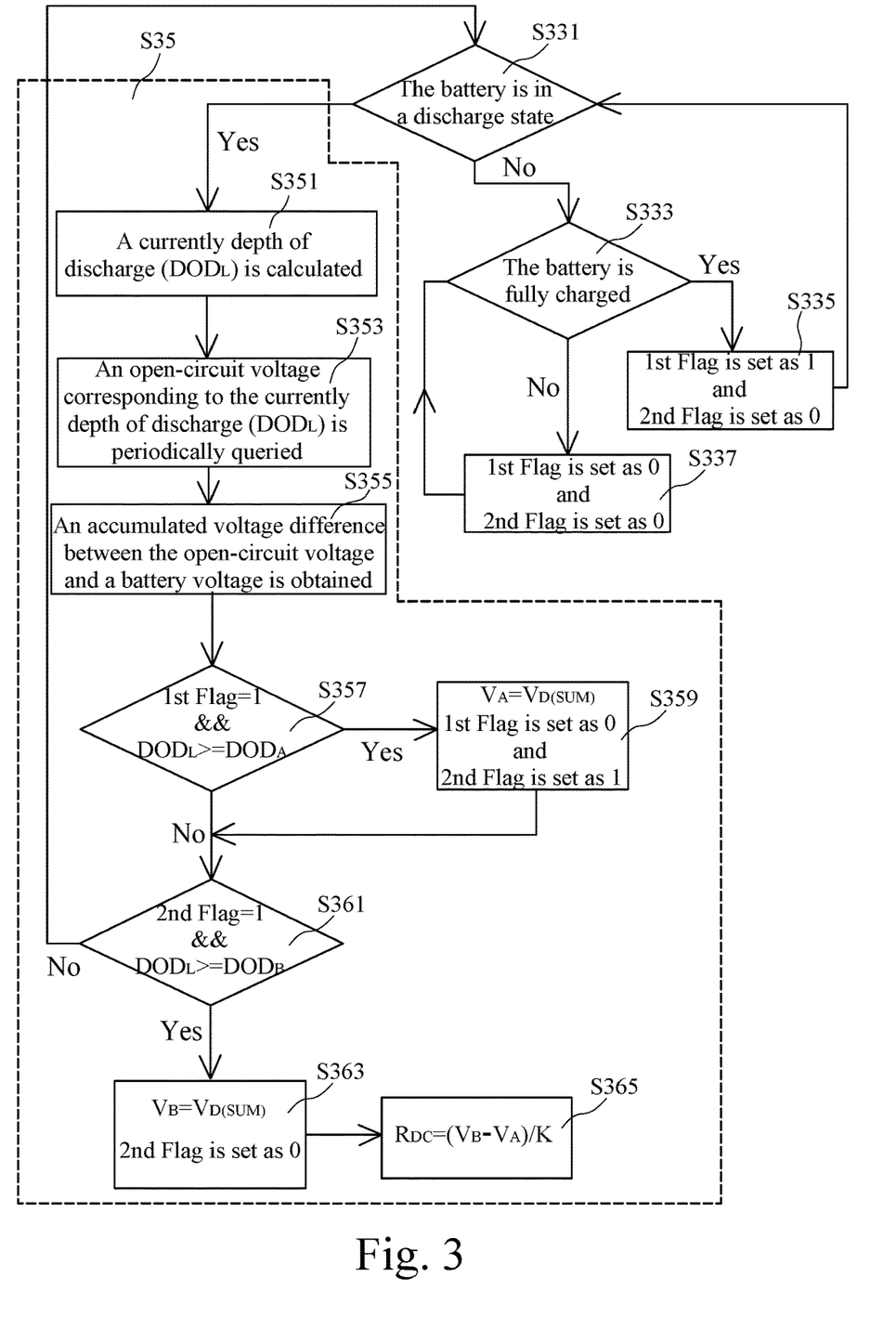
FIG. 3 is a flow chart of a method for estimating a direct current internal resistance of the battery according to the invention.

If the battery 10 is fully charged and a depth of discharge (DOD) of the battery 10 is 0%, then it continues to perform step S335, in which the processor 11 sets the $1^{ST}$ flag 1211 as 1 and the $2^{ND}$ flag 1212 as 0, and it returns to step S331; otherwise, if the battery 10 is not fully charged, then it performs step S337, in which the processor 11 sets the $1^{ST}$ flag 1211 as 0 and the $2^{ND}$ flag 1212 as 0, and then it returns to step S333. Thus, before executing the direct current internal resistance estimation process S35, the battery 10 needs to be in a full charge state, the $1^{ST}$ flag 1211 is set as 1, and the $2^{ND}$ flag 1212 is set as 0.

In the direct current internal resistance estimation process S35, firstly, at step S351, the processor 11 utilizes the current measuring circuit 13 and the voltage measuring circuit 14 to periodically measure a currently discharge current ($I_L$) and currently battery voltage ($V_L$) of the battery 10 and to continuously calculate a currently depth of discharge ($DOD_L$) according to the periodically measured discharge current ($I_L$), such as $DOD_L = \int I_L dt$. At step S353, the processor 11 periodically queries an open-circuit voltage ($V_{ocv}$) corresponding to the currently depth of discharge ($DOD_L$) from the open-circuit voltage curve 123 or the lookup table 125. Then, at step S355, the processor 11 subtracts the measured currently battery voltage ($V_L$) from the open-circuit voltage ($V_{ocv}$) corresponding to the currently depth of discharge ($DOD_L$) to obtain a voltage difference $V_D = V_{ocv} - V_L$, and continuously accumulates the voltage difference $V_D$ to obtain an accumulated voltage difference $V_{D(SUM)} = \int (V_{OCV} - V_L) dt$.

At step S357, the processor 11 determines whether the currently depth of discharge ($DOD_L$) is greater than or equal to the first depth of discharge threshold value ($DOD_A$) and whether the $1^{ST}$ flag is set as 1. If the currently depth of discharge ($DOD_L$) is greater than or equal to the first depth of discharge threshold value ($DOD_A$) and less than the second depth of discharge threshold value ($DOD_B$) and the $1^{ST}$ flag is set as 1, step S359 is performed, in which the processor 11 records a first discharge time $T_a$ corresponding to the battery 10 being discharged to the first depth of discharge threshold value ($DOD_A$), the currently accumulated voltage difference $V_{D(SUM)} = \int_0^a (V_{ocv} - V_L) dt$ is taken as a first accumulated voltage difference $V_A = V_{D(SUM)}$, and the setting of the $1^{ST}$ flag is changed from 1 to 0, and the setting of the $2^{ND}$ flag is changed from 0 to 1, and it continues to perform step S361. If the currently depth of discharge ($DOD_L$) is not greater than or not equal to the first depth of discharge threshold value ($DOD_A$) or the $1^{ST}$ flag is set as 0, step S361 will be directly performed. At step S361, the processor 11 determines whether the currently depth of discharge ($DOD_L$) is greater than or equal to the second depth of discharge threshold value ($DOD_B$) and whether the $2^{ND}$ flag is set as 1. If the currently depth of discharge ($DOD_L$) is greater than or equal to the second depth of discharge threshold value ($DOD_B$) and the $2^{ND}$ flag is set as 1, step S363 is performed, in which the processor 11 records a second discharge time $T_b$ corresponding to the battery 10 being discharged to the second depth of discharge threshold value ($DOD_B$), the currently accumulated voltage difference $V_{D(SUM)} = \int_0^b (V_{ocv} - V_L) dt$ is taken as a second accumulated voltage difference $V_B = V_{D(SUM)}$, the setting of the $2^{ND}$ flag is changed from 1 to 0, and it continues to perform step S365. At step S365, the processor 11 substitutes the first accumulated voltage difference $V_A$, the second accumulated voltage difference $V_B$ and a K value into a direct current internal resistance expression, such as $R_{DC} = (V_A - V_B)/K$, and then a direct current internal resistance ($R_{DC}$) 101 can be calculated. In an embodiment of the present invention, the K value is a discharging amount of the battery 10 in the depth of discharge detection interval 111.

Figure 5:
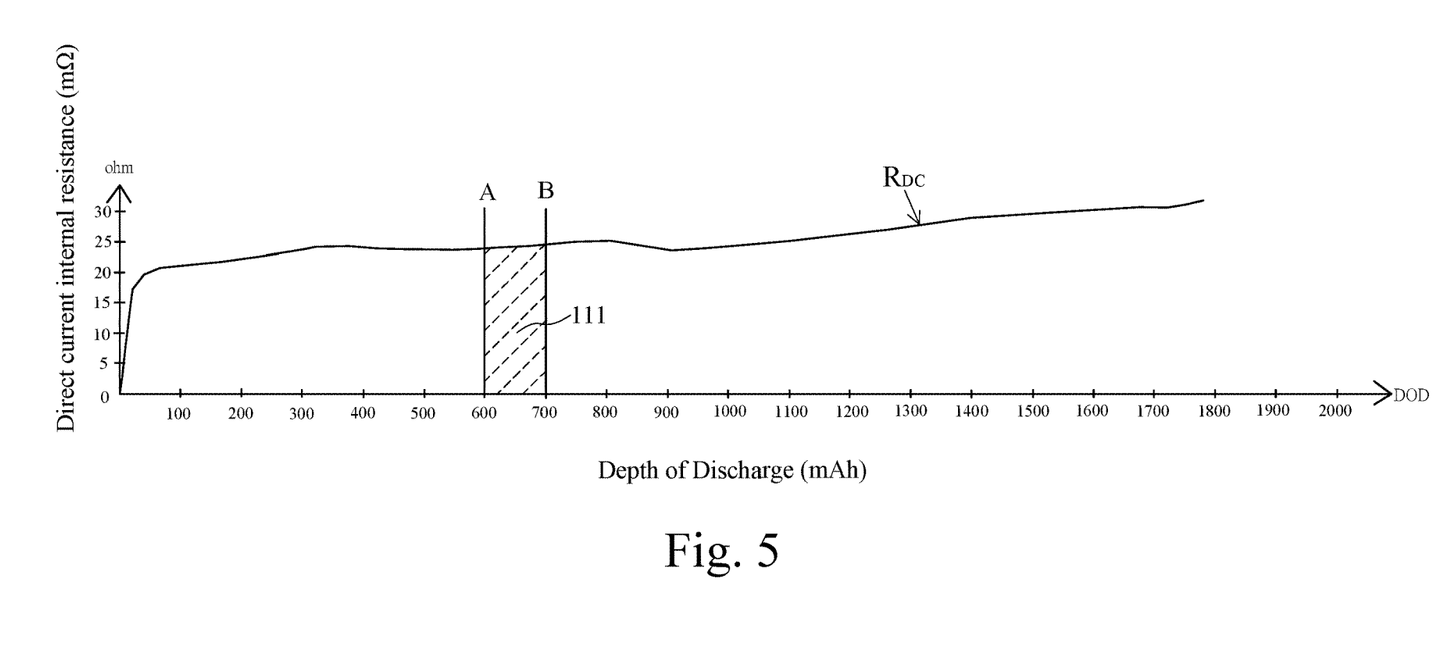
FIG. 5 is a curve chart of the direct current internal resistance of the battery according to the invention.

Specifically, as shown in FIGS. 4 and 5, when the battery 10 is discharged to the first depth of discharge threshold value ($DOD_A$), the processor 11 will obtain the first accumulated voltage difference $V_A = \int_0^a (V_{ocv} - V_L) dt$ between the open-circuit voltage ($V_{ocv}$) and the battery voltage ($V_L$) at the first discharge time $T_a$. When the battery 10 is discharged to the second depth of discharge threshold value ($DOD_B$), the processor 11 will obtain the second accumulated voltage difference $V_B = \int_0^b (V_{ocv} - V_L) dt$ between the open-circuit voltage ($V_{ocv}$) and the battery voltage ($V_L$) at the second discharge time $T_b$. The processor 11 subtracts the second accumulated voltage difference ($V_B$) from the first accumulated voltage difference ($V_A$), such as $V_A - V_B = \int_a^b (V_{ocv} - V_L) dt$, and $V_A - V_B = \int_a^b (V_{ocv} - V_L) dt = R_{DC} I_L dt$ is obtained according to Ohm's law. Additionally, in the present invention, when the battery 10 is discharged to the first depth of discharge threshold value ($DOD_A$), it will correspond to the first preset discharge time $T_a$, and when the battery is discharged to the second depth of discharge threshold value ($DOD_B$), it will correspond to the second preset discharge time $T_b$. Therefore, $V_A - V_B = \int_a^b (V_{ocv} - V_L) dt = \int_a^b R_{DC} I_L dt = \int_A^B R_{DC} dk$. Thus, the discharging amount (K) in the depth of discharge detection interval 111 will be defined as $K = \int_a^b I_L dt$. Accordingly, the difference value ($V_A - V_B$) between the first accumulated voltage difference and the second accumulated voltage difference is divided by the discharging amount (K) in the depth of discharge detection interval 111, and then the direct current internal resistance ($R_{DC}$) 101 can be obtained.

To sum up, according to the invention, the method for estimating the direct current internal resistance of the battery defines the depth of discharge detection interval 111. If the depth of discharge ($DOD_L$) completely passes through the depth of discharge detection interval 111 in the discharge process of the battery 10, the processor 11 calculates the accumulated voltage difference ($V_A - V_B$) between the open-circuit voltage ($V_{ocv}$) and the battery voltage ($V_L$) in the depth of discharge detection interval 111, and calculates the discharging amount (K) in the depth of discharge detection interval 111, so that a relatively accurate direct current internal resistance ($R_{DC}$) 101 can be estimated by dividing the accumulated voltage difference ($V_A - V_B$) in the depth of discharge interval 111 by the discharging amount (K) in the depth of discharge detection interval 111.

The above mentioned is only an embodiment of the invention and is not intended to limit the scope of the implementations of the invention, i.e., all equivalent variations and modifications of the shapes, structures, features and spirits described within the scope of the claims of the invention shall be included within the scope of the claims of the invention.

The invention claimed is:

1. A method for estimating a direct current internal resistance, applied to a battery, and comprising:
   defining a depth of discharge detection interval comprising a first depth of discharge threshold value and a second depth of discharge threshold value;
   executing a direct current internal resistance estimation process via a direct current internal resistance estimation program when the battery is in a discharge state, the direct current internal resistance estimation process comprising:
   periodically measuring a currently discharge current and a currently battery voltage of the battery;
   calculating a currently depth of discharge according to the periodically measured currently discharge current;
   querying an open-circuit voltage corresponding to the currently depth of discharge from an open-circuit voltage curve or a lookup table;
   subtracting the currently battery voltage from the open-circuit voltage corresponding to the currently depth of discharge to obtain a voltage difference, and continuously accumulating the voltage difference to obtain a currently accumulated voltage difference;
   if the currently depth of discharge is greater than or equal to the first depth of discharge threshold value, the currently accumulated voltage difference being a first accumulated voltage difference;
   if the currently depth of discharge is greater than or equal to the second depth of discharge threshold value, the currently accumulated voltage difference being a second accumulated voltage difference; and
   dividing a difference value between the first accumulated voltage difference and the second accumulated voltage difference by a discharging amount in the depth of discharge detection interval to obtain the direct current internal resistance.

2. The method for estimating the direct current internal resistance according to claim 1, wherein the direct current internal resistance estimation program comprises a $1^{ST}$ flag and a $2^{ND}$ flag; when the $1^{ST}$ flag is set as 1, an action of detecting whether the currently depth of discharge reaches the first depth of discharge threshold value is enabled; when the $1^{ST}$ flag is set as 0, the action of detecting whether the currently depth of discharge reaches the first depth of discharge threshold value is disabled; when the $2^{ND}$ flag is set as 1, an action of detecting whether the currently depth of discharge reaches the second depth of discharge threshold value is enabled; and when the $2^{ND}$ flag is set as 0, the action of detecting whether the currently depth of discharge reaches the second depth of discharge threshold value is disabled.

3. The method for estimating the direct current internal resistance according to claim 2, further comprising, before executing the direct current internal resistance estimation process:
   executing a process for monitoring whether the battery is in the discharge state, if yes, executing the direct current internal resistance estimation process, and if not, executing a process for monitoring whether the battery is fully charged; and executing the process for monitoring whether the battery is fully charged, comprising: if the battery is monitored to be fully charged, setting the $1^{ST}$ flag as 1, setting the $2^{ND}$ flag as 0, and returning to executing the process for monitoring whether the battery is in the discharge state; or if the battery is monitored not to be fully charged, setting the $1^{ST}$ flag as 0, setting the $2^{ND}$ flag as 0, and continuing to execute the process for monitoring whether the battery is fully charged.

4. The method for estimating the direct current internal resistance according to claim 3, wherein before executing the direct current internal resistance estimation process, the battery needs to be fully charged, the $1^{ST}$ flag is set as 1, and the $2^{ND}$ flag is set as 0.

5. The method for estimating the direct current internal resistance according to claim 3, wherein when the currently depth of discharge is greater than or equal to the first depth of discharge threshold value and less than the second depth of discharge threshold value, the setting of the $1^{ST}$ flag is changed from 1 to 0, and the setting of the $2^{ND}$ flag is changed from 0 to 1; and when the currently depth of discharge is greater than or equal to the second depth of discharge threshold value, the setting of the $2^{ND}$ flag is changed from 1 to 0.

6. The method for estimating the direct current internal resistance according to claim 1, wherein a measuring process of the open-circuit voltage curve is executed in advance before performing the method for estimating the direct current internal resistance, the measuring process of the open-circuit voltage curve comprising:
   fully charging the battery;
   discharging the battery at a constant discharge current;
   periodically measuring a currently open-circuit voltage of the battery;
   obtaining the currently depth of discharge according to a currently discharging amount of the battery;
   recording the currently open-circuit voltage corresponding to a currently discharge time and the currently depth of discharge corresponding to the currently discharge time; and
   determining whether the currently open-circuit voltage of the battery is equal to a cut-off discharge voltage; if the currently open-circuit voltage of the battery is equal to the cut-off discharge voltage, discharging of the battery being stopped to construct the open-circuit voltage curve according to each of the currently open-circuit voltages and each of the current depths of discharge corresponding to each of the currently discharge times; and if the currently open-circuit voltage of the battery is greater than the cut-off discharge voltage, discharging of the battery being continued, and recording of the currently open-circuit voltage corresponding to the currently discharge time and the currently depth of discharge corresponding to the currently discharge time being continued.

7. The method for estimating the direct current internal resistance according to claim 1, further comprising, before executing the direct current internal resistance estimation process:
   measuring whether the present current of the battery is less than zero, if the present current is less than zero and the battery is in the discharge state, the direct current internal resistance estimation process will be executed; and, if the present current is greater than or equal to zero and the battery is in a charge state or a static state, monitoring whether the battery is fully charged.

* * * * *